United States Patent
Grosse et al.

(10) Patent No.: US 7,455,906 B2
(45) Date of Patent: Nov. 25, 2008

(54) TRIBOLOGICALLY LOADED COMPONENT AND ACCOMPANYING GAS ENGINE OR INTERNAL COMBUSTION ENGINE

(75) Inventors: Stefan Grosse, Gerlingen (DE); Sascha Henke, Weil der Stadt (DE); Rainer Feuerfeil, Gerlingen (DE); Andreas Gross, Aachen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/740,710

(22) Filed: Dec. 18, 2003

(65) Prior Publication Data
US 2004/0144335 A1    Jul. 29, 2004

(30) Foreign Application Priority Data
Dec. 18, 2002 (DE) ................ 102 59 174

(51) Int. Cl.
*B32B 9/00* (2006.01)
(52) U.S. Cl. .................... 428/408; 428/336
(58) Field of Classification Search ........... 428/408, 428/698, 336
See application file for complete search history.

(56) References Cited

U.S. PATENT DOCUMENTS

| | | | |
|---|---|---|---|
| 4,597,844 A * | 7/1986 | Hiraki et al. ............. 428/408 |
| 5,202,156 A | 4/1993 | Yamamoto et al. |
| 5,223,765 A | 6/1993 | Staron et al. |
| 5,237,967 A * | 8/1993 | Willermet et al. .......... 428/408 |
| 5,250,149 A | 10/1993 | Kimoto et al. |
| 5,271,971 A | 12/1993 | Herb et al. |
| 5,346,729 A | 9/1994 | Pitts et al. |
| 5,387,443 A | 2/1995 | Ota et al. |
| 5,523,121 A | 6/1996 | Anthony et al. |
| 5,776,600 A * | 7/1998 | Katayama et al. ........... 428/408 |
| 5,942,317 A * | 8/1999 | White ..................... 428/336 |
| 5,948,532 A * | 9/1999 | Hwang et al. ............. 428/408 |
| 6,033,533 A | 3/2000 | Sugiyama et al. |

(Continued)

FOREIGN PATENT DOCUMENTS

DE      35 28 261      2/1987

(Continued)

OTHER PUBLICATIONS

A. Erdemir et al., "Effect of source gas and deposition method on friction and wear performance of diamond-like carbon films", Surf. and Coatings Technology, 94-95, (1997), pp. 525 ff.

(Continued)

*Primary Examiner*—Archene Turner
(74) *Attorney, Agent, or Firm*—Kenyon & Kenyon LLP

(57) ABSTRACT

A tribologically loaded component, in particular an injection needle, an injection valve, or a component of a combustion-engine injection system. This component has a surface region, which moves in relation to a counterbody during operation, is tribologically loaded in the process, and is provided with a first coating. This first coating has a first layer of diamond-like carbon having a hydrogen level of at least 30 atom %. Additionally provided is a gas engine or an internal combustion engine, which is driven by a dry gas, such as natural gas or hydrogen, as a fuel, or is driven under oil-free and/or water-free combustion conditions, and has such a tribologically loaded component.

11 Claims, 1 Drawing Sheet

U.S. PATENT DOCUMENTS

| | | | |
|---|---|---|---|
| 6,126,793 A | 10/2000 | Sugiyama et al. | |
| 6,183,818 B1 | 2/2001 | Vohra et al. | |
| 6,193,585 B1 | 2/2001 | Tanabe et al. | |
| 6,194,047 B1 | 2/2001 | Hayashi | |
| 6,352,366 B1 * | 3/2002 | Schneeberger et al. | 384/45 |
| 6,416,865 B1 * | 7/2002 | Fujii et al. | 428/408 |
| 6,506,037 B1 * | 1/2003 | Bush et al. | 418/178 |
| 6,524,687 B2 * | 2/2003 | Horng et al. | 428/408 |
| 6,548,173 B2 * | 4/2003 | Erdemir et al. | 428/408 |
| 6,652,969 B1 * | 11/2003 | Murakami et al. | 428/408 |
| 6,666,671 B1 * | 12/2003 | Olver et al. | 418/173 |
| 6,740,393 B1 * | 5/2004 | Massler et al. | 428/408 |
| 6,875,492 B1 * | 4/2005 | Pirzada et al. | 428/408 |
| 6,904,935 B2 * | 6/2005 | Welty et al. | 137/625.17 |
| 6,941,854 B2 * | 9/2005 | Hotger et al. | 92/169.1 |
| 6,994,474 B2 * | 2/2006 | Kinno et al. | 384/492 |
| 2003/0126733 A1 * | 7/2003 | Bush et al. | 29/458 |

FOREIGN PATENT DOCUMENTS

| | | |
|---|---|---|
| DE | 38 32 453 | 4/1989 |
| DE | 100 13 198 | 9/2001 |
| DE | 100 38 954 | 2/2002 |
| DE | 101 046 14 | 8/2002 |
| EP | 0 676 484 | 3/1999 |
| GB | 2 358 409 | 7/2001 |
| WO | WO 97/04142 | 2/1997 |
| WO | WO 97/13892 | 4/1997 |
| WO | WO 02/031891 | 4/2002 |

OTHER PUBLICATIONS

Fontaine, J. et al., "Tribochemistry between hydrogen and diamond-like carbon films," 2001 pp. 286-291, Surface and Coatings Technology.

* cited by examiner

TRIBOLOGICALLY LOADED COMPONENT AND ACCOMPANYING GAS ENGINE OR INTERNAL COMBUSTION ENGINE

FIELD OF THE INVENTION

The present invention relates to a tribologically stressed component, in particular an injection needle, an injection valve, or a component of an injection system of an internal combustion engine, as well as a gas engine or an internal combustion engine having such a tribologically loaded component.

BACKGROUND INFORMATION

To date, valves based on gasoline injection valves have been frequently used in gas engines. Since natural gas used up to this point contains a small fraction of oil due to oil-sealed compressors, these valves have a sufficiently long functional life, since very small amounts of oil are already sufficient for reliable operation.

However, in future applications, one must be prepared for the fact that gas engines will increasingly be driven by gases that are compressed in an oil-free manner and are, at the same time, almost completely dried with the aid of, in particular, a low-temperature dryer. Tests with such oil-free, dry gases in engines having gasoline injection valves according to the related art have shown that this reduces the functional life of the valves from several thousand hours at present, to a few hours. In particular, it was determined that valve needles already seize up after 10 hours to 100 hours of operating time or testing time, using dry nitrogen. This problem also relates to further dry gases, such as hydrogen.

On the other hand, carbon-containing layers in the form of so-called DLC layers (diamond-like carbon) or iC-WC layers are also used to provide wear protection to components subjected to high tribological loading, e.g. components of injection systems or injection valves. However, even these fail during use in an absolutely dry environment. In the case of injectors, this may easily be seen in a model wear test (vibrational wear), in a time-lapse motion camera. In this context, a test piece is loaded by an oscillating ball made of steel (100Cr6), a measure of the durability of the test piece provided with such a coating being the time to failure of the coating on the test piece.

In addition, it is known that the coefficient of friction in a dry environment may be reduced by increasing the level of hydrogen in diamond-like carbon layers or DLC layers. Thus, in A. Erdemir et al., "Effect of source gas and deposition method on friction and wear performance of diamond-like carbon films", Surf. and Coatings Technology, 94-95, (1997), pages 525 ff., it is said that diamond-like carbon layers have a coefficient of friction of 0.02 in a dry environment, as long as they have an increased level of hydrogen. In this case, such an increase in the level of hydrogen is achieved by using methane or a methane/hydrogen mixture in place of acetylene during the deposition of the diamond-like carbon layer.

Furthermore, PCT International Publication No. WO 97/04142 describes a coating and a method for producing it, the coating also having a low coefficient of friction under dry conditions, but only having a low wear resistance. The coating produced there is made of molybdenum silicide and is applied to the surface to be coated, using a sputtering method.

An object of the present invention is to provide a tribologically loaded component, which is provided with a coating so that the component may also be used in an internal combustion engine or a gas engine driven by a dry, in particular oil-free gas as a fuel. In particular, the tribologically loaded component shall be provided with a coating, which has both a low coefficient of friction and a high wear resistance.

SUMMARY OF THE INVENTION

The tribologically loaded component of the present invention has the advantage over the related art that, in a dry environment and/or oil-free environment, it has a markedly higher wear resistance than a conventional coating having a layer of diamond-like carbon, or than the molybdenum-silicide coating known from PCT International Publication No. WO 97/04142.

In a model wear test (vibrational wear), in particular under dry and oil-free conditions, the layer of diamond-like carbon having a hydrogen level of at least 30 atom % has, in particular, markedly improved service lives in comparison with layers of diamond-like carbon having a typical hydrogen level of approximately 25 atom %.

In this respect, the tribologically loaded component is suitable, above all, for use in a gas engine or in an internal combustion engine driven by a dry gas having natural gas or hydrogen as a fuel, or in an internal combustion engine operated under oil-free and/or water-free combustion conditions.

In this context, the tribologically loaded component is, particularly advantageously, an injection needle, an injection valve, or a component of an injection system of an internal combustion engine, such as a sealing seat, a guide region of an injection needle, or a seat region of an injection needle.

Thus, it is particularly advantageous that the tribologically loaded component is also suitable for operating conditions, in which there is non-lubricated, solid contact between the surface region of the counterbody and the surface region of the component.

In lubricated contacts, a lubricating film normally separates the two friction partners. However, under mixed frictional conditions, or under extreme operating parameters, the lubricating film may break down and consequently result in direct, solid contact of the two friction partners. In the case of dry operating conditions, such as those typically occurring in a gas engine driven by a dry gas such as natural gas or hydrogen, and where such solid contact is unavoidably present over the entire operational life of the system, the tribologically loaded component must be designed in such manner, that no so-called seizing occurs.

In this case, the tribologically loaded component has the advantage that the layer having the diamond-like carbon may at least partially assume the function of an otherwise present lubricating film between the component and the counterbody. In particular, this layer prevents the direct contact of two steel surfaces, and therefore prevents the tendency of such metallic surfaces to adhere, and, in addition to its high wear resistance or abrasion resistance, the simultaneously low coefficient of friction of the diamond-like carbon layer achieves a kind of solid lubrication. Finally, the provided layer of diamond-like carbon also reduces the chemical reactivity of the surface of the counterbody and the surface of the coated component.

In summary, the coating of the present invention having the layer of diamond-like carbon containing a high level of hydrogen allows, on one hand, low-friction wear protection of the tribologically loaded component, in particular in the case of a component in the form of a component of a fuel-injection system during the use of alternative, dry, gaseous, and oil-free fuels. On the other hand, the coating of the present invention having the layer of diamond-like carbon containing a high level of hydrogen allows a significant increase in the service life of the tribologically loaded component and the counterbody in frictional contact with it during operation, by reducing the surface reactivity and metallic adhesion tendency and preventing microwelds and tribological oxidation.

DETAILED DESCRIPTION

The present invention is explained, using the example of coating the guide region of a customary injection needle in an injection system of a motor-vehicle engine, which is specially manufactured as a gas engine or an internal combustion engine operated under oil-free and/or water-free combustion conditions.

As an alternative, the seat region of the injection needle, the intake valve, or other components of the injection technology may also be provided with a thin, low-friction, and simultaneously wear-resistant coating in regions of high tribological loading.

Diamond-like carbon layers, which are deposited from a plasma jet with the aid of a plasma-jet source according to German Patent Application No. DE 101 046 14, are applied as a coating.

In this context, an important characteristic of the present invention is that the hydrogen level in the produced layer of diamond-like carbon on the tribologically loaded component has, in comparison with the related art, a markedly increased hydrogen level of at least 30 atom %. In contrast, the maximum hydrogen level in known layers made of diamond-like carbon layers is 25 atom %.

In addition to a reduction in the coefficient of friction, the increase in the hydrogen level in the diamond-like carbon layer to a least 30 atom %, preferably at least 32 atom %, and especially between 32 atom % and 40 atom %, surprisingly allows a particularly wear resistant or abrasion resistant layer to be achieved, as well.

The plasma-jet source according to German Patent Application No. DE 101 046 14 also allows such high hydrogen levels or high hydrogen-to-carbon ratios to be set in a particularly simple manner. However, other techniques for depositing diamond-like carbon layers are also theoretically suitable for increasing the hydrogen level in the obtained layers to at least 30 atom %. For example, this may be accomplished by intermixing an increased flow of hydrogen, or by selecting methane as a carbon donor in place of the usual $C_2H_2$ during the deposition of the diamond-like carbon layer.

Figure 1:
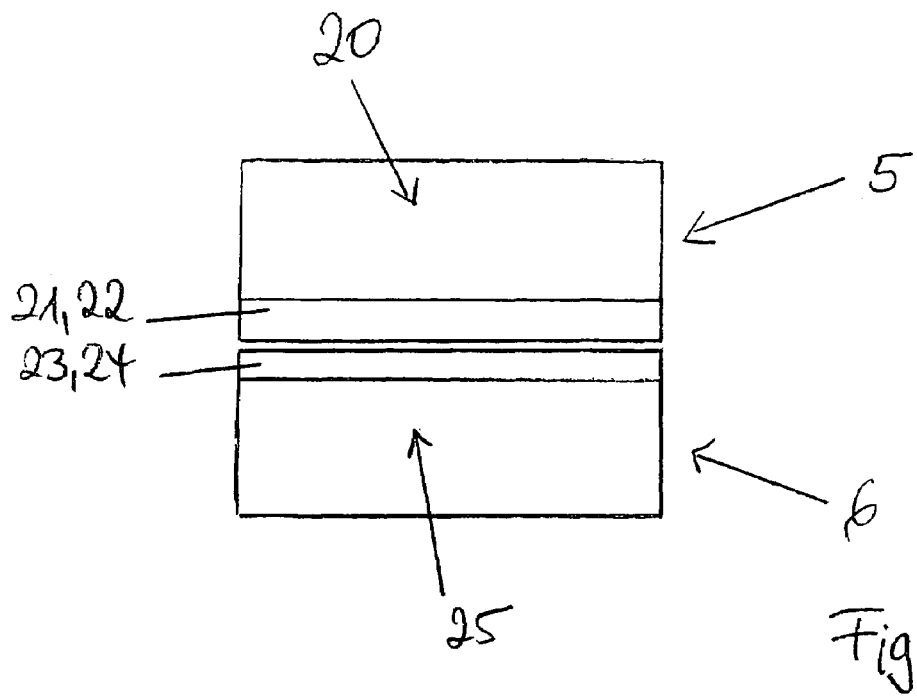
FIG. 1 shows a diagrammatic sketch of a section of the component and the counterbody assigned to it.

In particular, FIG. 1 shows a section of a tribologically loaded component 5, e.g. an injection needle of a combustion-engine injection system, having a surface region 20 on which a first coating 21 having a first layer 22 is located. In the explained example, first coating 21 is made of first layer 22, but an adhesion layer may also be provided between first layer 22 and component 5. Component 5 is made of, for example, steel.

In addition, a counterbody 6, such as a guide member for injection needle 5, which moves in relation to the component during operation and is likewise made of, e.g. steel, is situated opposite to component 5.

A second coating 23 having a second layer 24 is provided in a surface region 25 of counterbody 6, which is situated opposite to surface region 20 of component 5. In the explained example, second coating 23 is made of second layer 24. However, e.g. an adhesion layer may also be provided between second layer 24 and counterbody 6 in a manner analogous to component 5.

With regard to structure and composition, second coating 23 is preferably constructed in a manner analogous to first coating 21 of tribologically loaded component 5.

First layer 22 and second layer 24 are made of diamond-like carbon having a hydrogen level of at least 30 atom %, e.g. 33 atom %.

They were applied to the surface of component 5 and the surface of counterbody 6, using a PECVD method (plasma enhanced chemical vapor deposition) according to German Patent Application No. DE 101 046 14. During the deposition, the carrier gas concentration was also changed with respect to deposition parameters conventional up to that point, by adding hydrogen.

The thickness of first layer 22 and second layer 24 is preferably between 0.5 µm and 20 µm, in particular between 1 µm and 10 µm.

In order to verify the improved characteristics of first layer 22 of diamond-like carbon having an increased hydrogen level, and the improved characteristics of second layer 24, over a coating according to PCT International Publication No. WO 97/04142 with regard to frictional characteristics and wear characteristics, a comparison test was conducted in the form of a vibrational wear test, with an oscillating steel ball (100Cr6 steel ball having a 4 mm diameter) as a test piece and the tribologically loaded component having coating 21 as a counterbody.

In this context, the load or normal force was 10 N, the amplitude of vibration was 200 µm, the vibrational frequency was 20 Hz, the surrounding temperature was 50° C., the testing period was 16 hours, and the thickness of the first layer was approximately 5.5 µm. In addition, dry nitrogen having a residual moisture content of less than 1% was used as a surrounding medium.

In this comparison test, first layer 22 of diamond-like carbon having a hydrogen level of approximately 33% was deposited, on one hand, on component 5, and, on the other hand, a sputtered-on molybdenum silicide coating according to PCT International Publication No. WO 97/04142 was produced on the surface of component 5.

Figure 2:
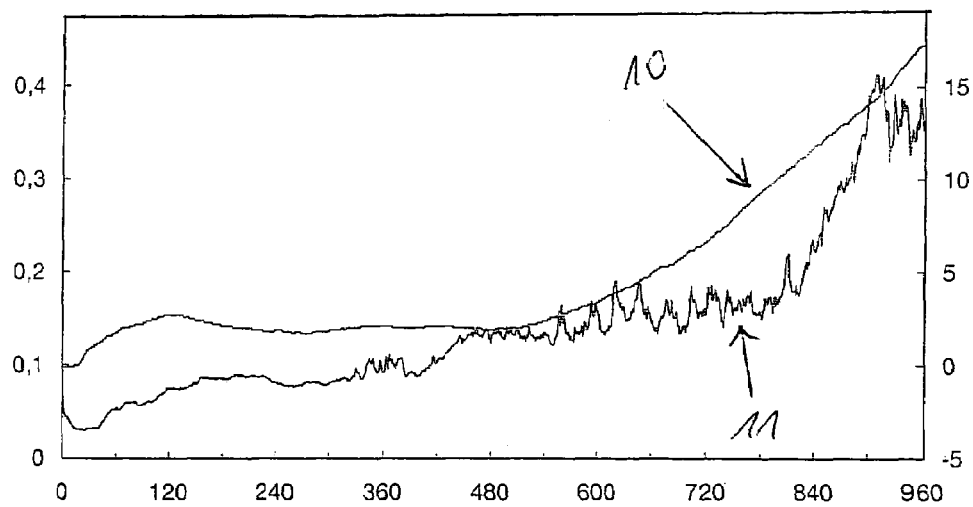
FIG. 2 shows a measurement of the friction coefficient of the tribologically loaded component as a function of time, as well as a measurement of the wear curve as a function of time.

FIG. 2 shows the result of this vibrational wear test in the case of tribologically loaded component 5 having the coating of the present invention. In this context, the time in minutes is initially plotted on the x axis, the coefficient of friction is plotted on the y axis, and the wear is plotted on the right y axis.

FIG. 2 shows the plot of the wear (right y axis) in µm as a function of the time in minutes (x axis) as first measurement curve 10, and the plot of friction coefficient µ (left y axis) as a function of the time (in minutes) as second measurement curve 11.

One can see that the coefficient of friction initially starts with a value of approximately 0.05 and reaches a value of approximately 0.1 up to a service life of approximately 840 minutes.

At the same time, the wear or abrasion continuously increases as of a service life of approximately 550 minutes, while almost no abrasion or wear is to be detected up to that point.

In the same test conditions, the molybdenum suicide layers, which were produced for comparison and have a layer thickness of approximately 1 µm, already break down at a service life of 30 to 90 minutes. In most cases, failure here due to adhesion problems is spontaneous and not continuous.

Due to a lack of adhesion, sputtered-on molybdenum silicide layers having layer thicknesses greater than 1 μm are scarcely manufacturable at present.

It can be gathered from FIG. 2 that the coating of the present invention is very well-suited for both reducing wear and reaching a low coefficient of friction, so that it may be used, in particular, for tribologically highly loaded components in injection technology, even under absolutely dry conditions.

What is claimed is:

1. A method of using a tribologically loaded component that includes a counterbody and a first surface region capable of moving in relation to the counterbody during operation, the first surface region being tribologically loaded in this context, the first surface region having a first coating, the first coating having a first layer of diamond-like carbon having a hydrogen level of at least 30 atom %, the first layer being situated in the first surface region on a surface of the component, the first coating having an adhesion layer situated between the first layer and the component, the first layer having a thickness of 0.5 μm to 20 μm, the method comprising:

during operation, providing a non-lubricated, solid contact between a second surface region of the counterbody and the first surface region of the component; and using the component in one of a gas engine and a combustion engine that is driven one of:

by a dry gas as a fuel, and under at least one of an oil-free combustion condition and a water-free combustion condition;

wherein the first layer is deposited by a plasma-jet source, from a plasma jet;

wherein the component is at least one of an injection needle, an injection valve, and a component of an internal combustion engine injection system; and wherein the hydrogen level of the first layer is between 32 atom % and 40 atom %.

2. The method as recited in claim 1, wherein the thickness of the first layer is between 1 μm and 10 μm.

3. The method as recited in claim 1, further comprising:

during operation, placing the second surface region of the counterbody and the first surface region of the component in frictional contact with each other.

4. The method as recited in claim 1, wherein the second surface region of the counterbody has a second coating provided with a second layer of diamond-like carbon that has a hydrogen level of at least 30 atom %.

5. The method as recited in claim 4, wherein the hydrogen level of the second layer is between 32 atom % and 40 atom %.

6. The method as recited in claim 4, wherein the second layer is situated in the second surface region on a surface of the counterbody.

7. The method as recited in claim 4, wherein the second coating has another adhesion layer situated between the second layer and the counterbody.

8. The method as recited in claim 4, wherein the second layer is deposited by a plasma-jet source, from a plasma jet.

9. The method as recited in claim 1, wherein the component of the internal combustion engine injection system is a sealing seat.

10. The method as recited in claim 1, wherein the component of the internal combustion engine injection system is a guide region of an injection needle.

11. The method as recited in claim 1, wherein the component of the internal combustion engine injection system is a seat region of an injection needle.

* * * * *